United States Patent
Sim et al.

(10) Patent No.: US 10,128,267 B2
(45) Date of Patent: Nov. 13, 2018

(54) NON-VOLATILE MEMORY DEVICE

(71) Applicant: SAMSUNG ELECTRONICS CO., LTD., Suwon-si, Gyeonggi-do (KR)

(72) Inventors: Woo Joo Sim, Hwaseong-si (KR); Wang Ho Shin, Seoul (KR); Kyu Bin Han, Incheon (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/661,401

(22) Filed: Jul. 27, 2017

(65) Prior Publication Data

US 2018/0175052 A1 Jun. 21, 2018

(30) Foreign Application Priority Data

Dec. 20, 2016 (KR) .......................... 10-2016-0174686

(51) Int. Cl.
| | |
|---|---|
| H01L 27/11 | (2006.01) |
| H01L 27/11582 | (2017.01) |
| H01L 27/11565 | (2017.01) |
| H01L 27/11568 | (2017.01) |

(52) U.S. Cl.
CPC .. *H01L 27/11582* (2013.01); *H01L 27/11565* (2013.01); *H01L 27/11568* (2013.01)

(58) Field of Classification Search
CPC ......... H01L 27/11582; H01L 27/11565; H01L 27/11568
See application file for complete search history.

(56) References Cited

U.S. PATENT DOCUMENTS

| | | | |
|---|---|---|---|
| 6,016,000 A | 1/2000 | Mosiehi | |
| 6,207,986 B1 | 3/2001 | Yamanaka et al. | |
| 6,534,868 B2 | 3/2003 | Sekiguchi | |
| 6,566,241 B2 | 5/2003 | Chun | |
| 6,861,313 B2 | 3/2005 | Song | |
| 7,968,447 B2 | 6/2011 | Lee et al. | |
| 2004/0232558 A1 | 11/2004 | Toda | |
| 2007/0249175 A1 | 10/2007 | Chen | |
| 2015/0270176 A1 | 9/2015 | Xie et al. | |
| 2016/0163729 A1* | 6/2016 | Zhang | H01L 27/11582 257/321 |
| 2016/0268286 A1* | 9/2016 | Tamura | H01L 27/11575 |
| 2016/0268300 A1* | 9/2016 | Sawabe | H01L 27/11582 |

FOREIGN PATENT DOCUMENTS

| | | |
|---|---|---|
| JP | 2004014816 A | 1/2004 |
| KR | 10-1280261 | 6/2013 |

* cited by examiner

*Primary Examiner* — Julia Slutsker
(74) *Attorney, Agent, or Firm* — Lee & Morse, P.C.

(57) ABSTRACT

A non-volatile memory device includes channel hole structures, bit lines, and intermediate wiring. The channel hole structures are arranged in a two-dimensional pattern on and extend vertically from a substrate. The bit lines extend in a first direction, are spaced apart from each other in a second direction crossing the first direction, and are electrically connected to the plurality of channel hole structures. The intermediate wiring which connects channel hole structures and the bit lines. The bit lines includes a first bit line and a second bit line directly connected to the channel hole structures through a first contact and spaced apart in the second direction. The intermediate wiring is between the first bit line and the second bit line.

20 Claims, 12 Drawing Sheets

NON-VOLATILE MEMORY DEVICE

CROSS-REFERENCE TO RELATED APPLICATION

Korean Patent Application No. 10-2016-0174686 filed on Dec. 20, 2016, and entitled, "Non-Volatile Memory Device," is incorporated by reference herein in its entirety.

BACKGROUND

1. Field

One or more embodiments described herein relate to a non-volatile memory device.

2. Description of the Related Art

A variety of memory devices have been developed. Examples include volatile memory devices and non-volatile memory devices. A volatile memory device does not retain data when power is removed. A non-volatile memory devices retains the data when power is removed. In order to improve integration of a non-volatile memory device (e.g., flash memory), a three-dimensional semiconductor memory has been proposed. One type of three-dimensional semiconductor memory includes vertically stacked memory cells, vertical channels, and metal wirings for connecting memory electrodes of the memory cells.

SUMMARY

In accordance with one or more embodiments, a non-volatile memory device includes a plurality of channel hole structures arranged in a two-dimensional pattern on and extending vertically from a substrate; a plurality of bit lines extending in a first direction, spaced apart from each other in a second direction crossing the first direction, and electrically connected to the plurality of channel hole structures; and an intermediate wiring which connects channel hole structures in the first direction among the plurality of channel hole structures and the plurality of bit lines, wherein the plurality of bit lines includes a first bit line and a second bit line directly connected to the channel hole structures through a first contact and spaced apart in the second direction, and wherein the intermediate wiring is between the first bit line and the second bit line.

In accordance with one or more other embodiments, a non-volatile memory device includes a plurality of intermediate contacts arranged in a two-dimensional pattern on and connected to a lower film; a plurality of bit lines on the plurality of intermediate contacts and directly connected to the intermediate contacts arranged along a first direction; and a plurality of intermediate wirings connecting at least a pair of intermediate contacts between bit lines connected to a plurality of intermediate contacts among the plurality of bit lines and disposed along a first direction among the plurality of intermediate contacts, and the bit lines which are not connected to the intermediate contacts, wherein the intermediate contacts include: a first intermediate contact directly connected to the bit line, and a second intermediate contact connected to the bit lines through the bit lines and the intermediate wirings, and the first intermediate contact and the second intermediate contact are in a matrix form which alternates in a second direction orthogonal to the first direction.

In accordance with one or more other embodiments, a non-volatile memory device includes channel hole structures; bit lines connected to the channel hole structures; and an intermediate wiring connecting the channel hole structures and the bit lines, wherein the bit lines include a first bit line and a second bit line directly connected to the channel hole structures through a first contact and wherein the intermediate wiring is between the first bit line and the second bit line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
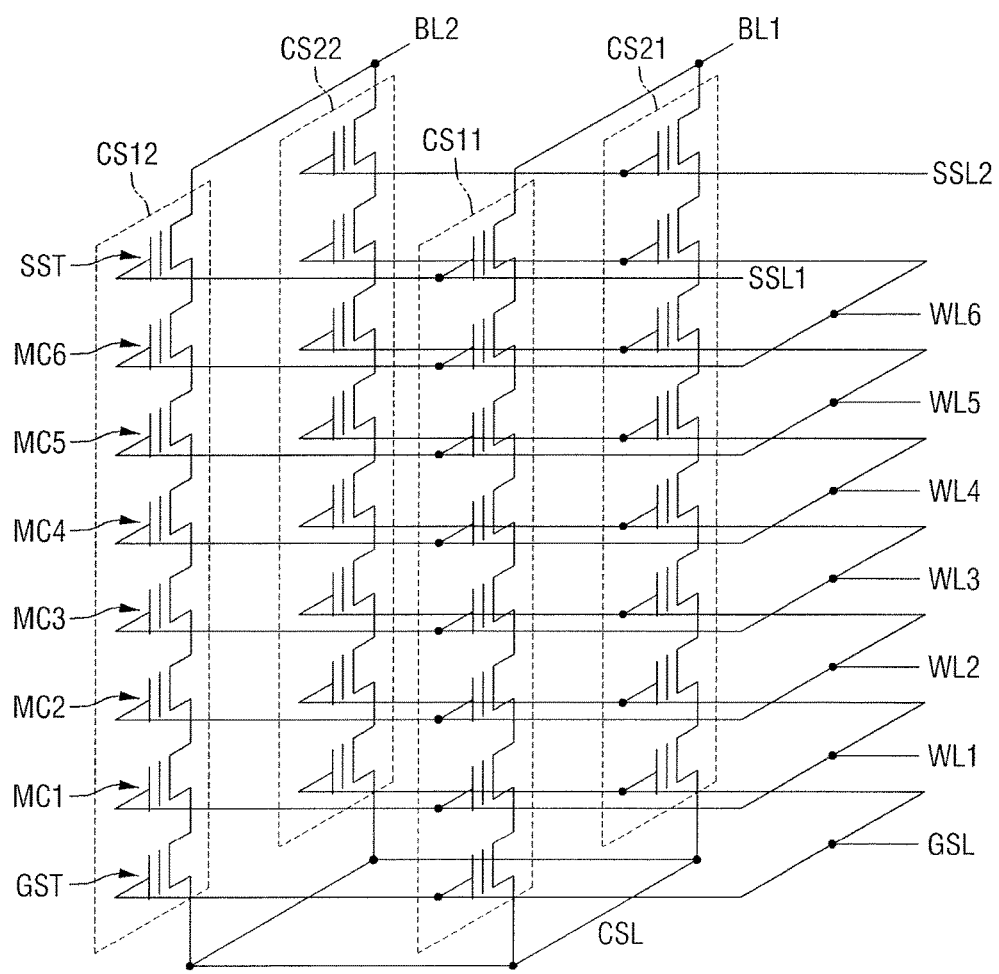
FIG. 1 illustrates an embodiment of a memory cell array.

FIG. 1 illustrates an embodiment of an equivalent circuit of a memory cell array 10 including a non-volatile memory device. Referring to FIG. 1, the memory cell array 10 may include a plurality of cell strings CS11, CS12, CS21, and CS22 extending in a vertical direction.

Each cell string CS11, CS12, CS21 and CS22 may include a ground selection transistor GST, a plurality of memory cell transistors MC1, MC2, . . . , MC6, and a string selection transistor which are connected in series with one another. Each cell string CS11, CS12, CS21, and CS22 in FIG. 1 has a single ground selection transistor GST and a single string selection transistor SST. In other embodiments, each cell string CS11, CS12, CS21, and CS22 may include two or more ground selection transistors GST and/or two or more string selection translators SST connected in series with one another. Further, each cell string CS11, CS12, CS21, and CS22 are illustrated to have six memory relays MC1, MC2, . . . , MC6. In other embodiments, each cell string CS11, CS12, CS21, and CS22 may have a different number of (e.g., eight or more) memory cell transistors MC1, MC2, . . . , MC6.

A plurality of cell strings CS11, CS12, CS21 and CS22 may be connected in units of rows and columns. The string selection transistor SST of each cell string CS11, CS12, CS21 and CS22 may be connected to a corresponding bit line BL1 and BL2. For example, the cell strings CS11 and CS21 commonly connected to the first hit line BL1 form a first column, and the cell strings CS12 and CS22 commonly connected to the second bit line BL2 may form a second column. Further, the string selection transistor SST of each of the cell strings CS11, CS12, CS21 and CS22 may be connected to the string selection lines SSL1 and SSL2. For example, the cell strings CS11 and CS12 commonly connected to the first string selection line SSL1 may form a first row, and the cell strings CS21 and CS22 commonly connected to the second string selection line SSL2 may form a second row.

A ground selection string GST of each of the cell string CS11, CS12, CS21, and CS22 is connected by a ground selection line GSL. The common source line CSL may be connected to the ground selection transistor GST of each of the cell strings cell CS11, CS12, CS21, and CS22.

Memory cell transistors MC1, MC2, . . . , and MC6 located at the same height may be connected to the same word lines WL1, WL2, . . . , and WL6. For example, the first memory cell transistor MC1 connected to a ground selection transistor GST may be connected to the first memory cell transistor MC1 of the adjacent column through the first word line WL1.

Figure 2:
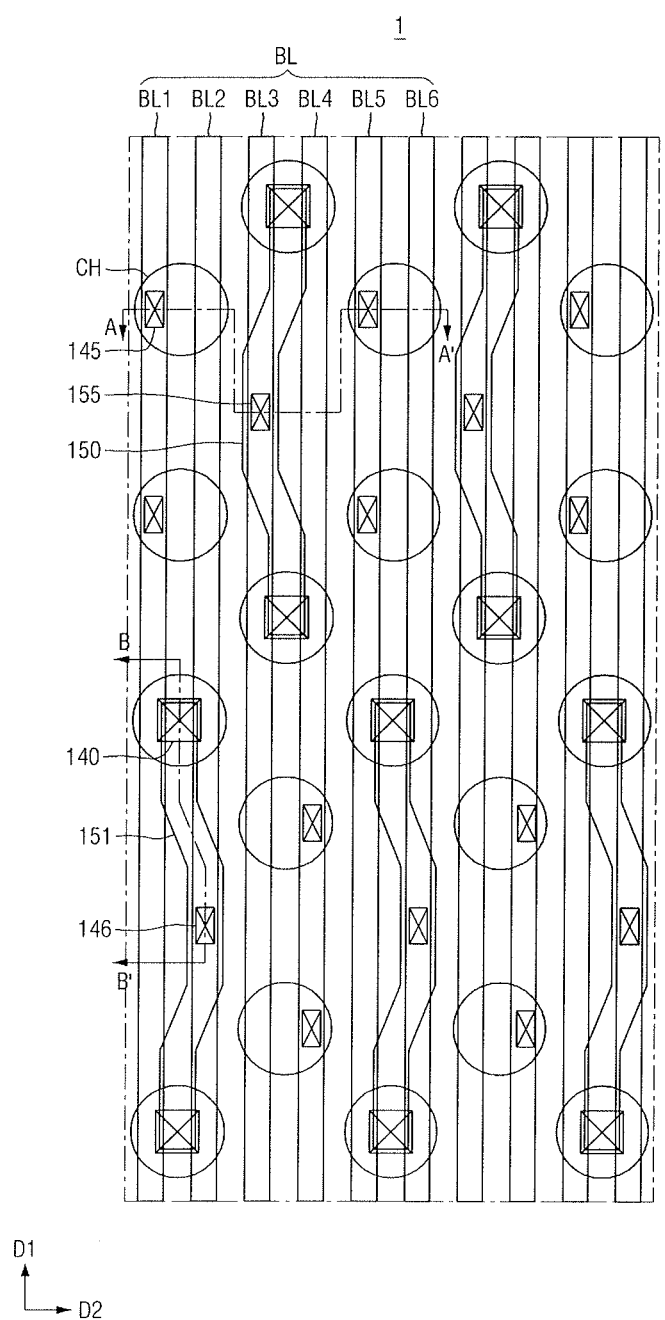
FIG. 2 illustrates an embodiment of a non-volatile memory device.
Figure 3:
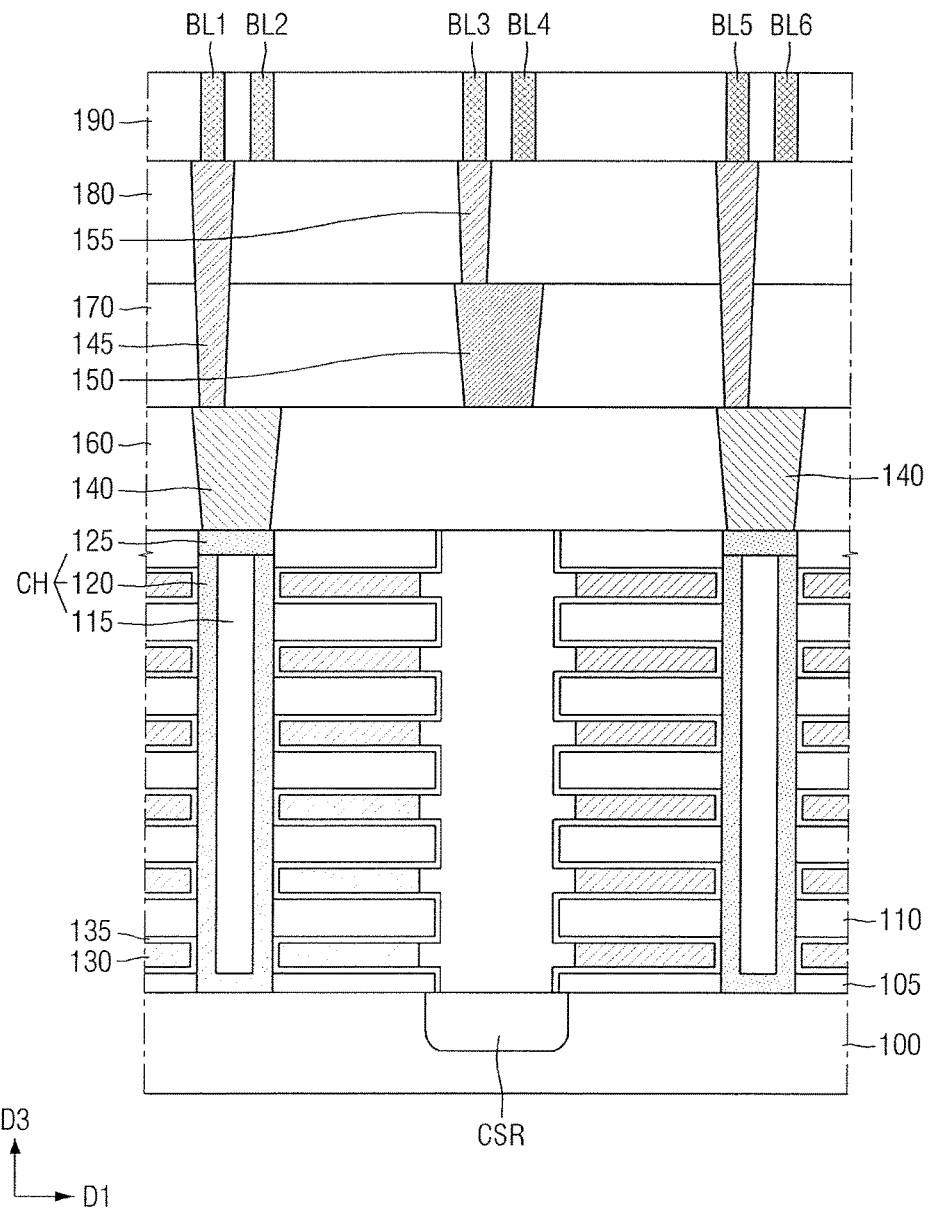
FIG. 3 illustrates a view along section line A-A' in FIG. 1.
Figure 4:
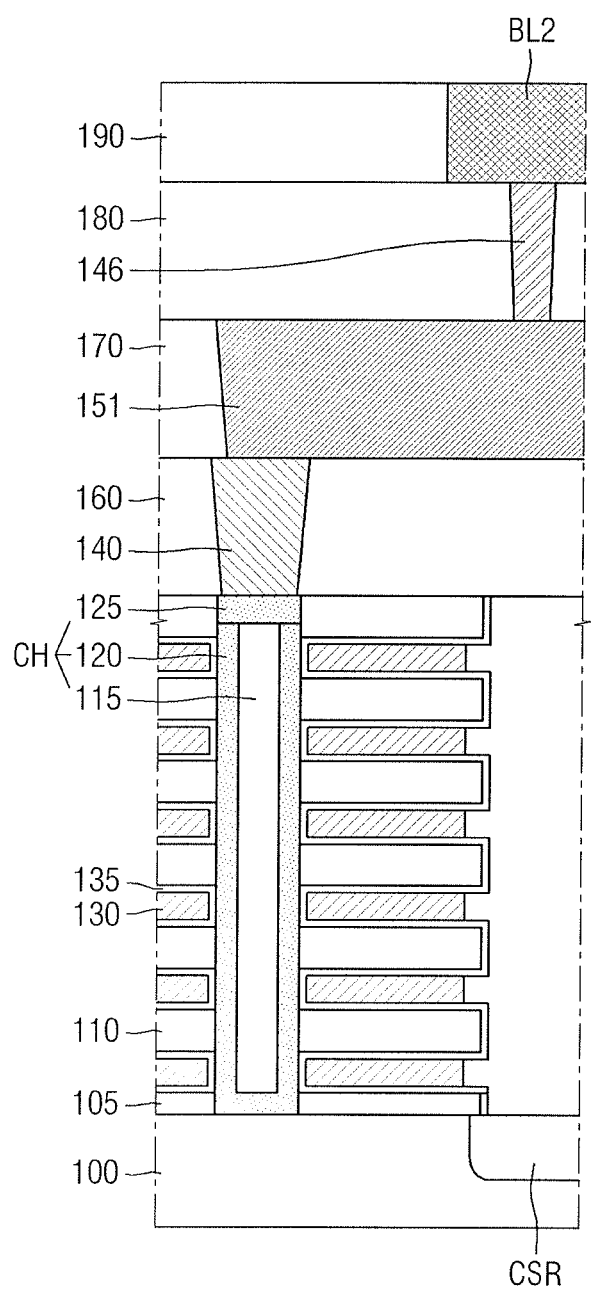
FIG. 4 illustrates a view along section line B-B' in FIG. 1.

FIG. 2 illustrates an embodiment of a non-volatile memory device 1. FIG. 3 illustrates a cross-sectional view of the non-volatile memory device 1 of FIG. 1 taken along the line A-A'. FIG. 4 illustrates a cross-sectional view of the non-volatile memory device 1 of FIG. 1 taken along the line B-B'.

Referring to FIGS. 2 to 4, the non-volatile memory device 1 includes a plurality of channel hole structures CH arranged on a substrate 100 in a two-dimensional pattern, bit lines BL1 to BL6 on a plurality of channel hole structures CH along a first direction D1, intermediate wirings 150 for connecting the bit lines BL and the channel hole structures CH, and intermediate contacts 140 for connecting the intermediate wiring 150 with the channel hole structures CH.

The substrate 100 may include, for example, a silicon substrate, a germanium substrate, a silicon-germanium substrate, a silicon-on-insulator (SOI) substrate or another type of substrate.

A common source region CSR may be formed in the substrate 100. The common source region CSR may include a conductive thin film on the semiconductor substrate or an impurity region formed in the substrate. The common source region CSR and the plurality of gate electrodes 130 may be electrically connected to one another.

The non-volatile memory device according to the present embodiment may include a common source line electrically connected to common source region CSR and extending in a third direction D3.

A plurality of channel hole structures CH may be arranged on the substrate 100 in a two-dimensional pattern. The two-dimensional patter of the channel hole structures CH may correspond to channel hole structures CH formed in a plurality of rows and columns along the first direction D1 and the second direction D2, respectively.

The channel hole structures CH may be arranged in a line along the first direction D1 to form a single column. A single column including the channel hole structures CH disposed along the first direction D1, and another column nearest or adjacent to the aforementioned column and including the channel hole structures CH disposed along the first direction D1, may not aligned side-by-side in the second direction D2. Such a configuration may include a column having another channel hole structure CH which is not interposed between one column and another column.

For example, for an odd-numbered column including channel hole structures CH aligned in the first direction D1, an even-numbered column including the channel hole structures CH may be offset in the predetermined first direction D1. Therefore, channel hole structures CH in the even-numbered columns and the odd-numbered columns may be disposed in a zigzag pattern.

As illustrated in FIG. 1, the upper surface of the channel hole structure CH may have a predetermined shape, e.g., circular, polygonal, or another shape.

The channel hole structure CH which has a cylindrical shape may include a plurality of gate electrodes 130 and insulating films 110 alternately stacked on a substrate 100 and may extend to penetrate through a third direction D3 perpendicular to the first direction D1 and the second direction D2.

The channel hole structure CH may include a filler insulating film 115, a vertical insulating film 120 wrapping around the filler insulating film 115, and a contact pad 125. The vertical insulating film 120 may fill the interior of the channel hole structure CH in a conformable manner. For example, the vertical insulating film 120 may warp around the side walls and the bottom surface of the filler insulating film 115.

The vertical insulating film 120 may include, for example, a tunnel film and a trap film. The tunnel film is a portion through which electric charge passes, and, for example, may be formed of a silicon oxide film, or a double layer of a silicon oxide film and a silicon nitride film. The trap film is a portion for storing electric charge which has passed through the tunnel film. The trap film may include, for example, a nitride film or a high dielectric constant (high-k) film. The nitride film may include, for example, one or more of silicon nitride, silicon oxynitride, or hafnium oxynitride. The high dielectric constant film may include, for example, at least one of hafnium oxide, hafnium silicon oxide, lanthanum oxide, lanthanum aluminum oxide, zirconium oxide, or another material. The filler insulating film 115 may fill a space defined by the inner sidewalls of the vertical insulating film 120, and may include insulating material, e.g., silicon oxide.

The contact pad 125 may be formed on the filler insulating film 115 and the vertical insulating film 120. The contact pad 125 may electrically connect the filler insulating film 115, the vertical insulating film 120, and the intermediate contact 140. The contact pad 125 may include, for example, at least one of doped semiconductors, metals, metal silicide, or metal nitrides.

The bottom surface of the channel hole structure CH may electrically contact the substrate 100.

The gate electrodes 130 may be spaced apart from the substrate 100 in the third direction D3 by a predetermined distance. The gate electrodes 130 may be spaced apart from one another in the third direction D3 by insulating films 110. For example, the gate electrodes 130 and the insulating films 110 may be stacked on the substrate 100.

The lowermost gate electrode 130 among the gate electrodes 130 may be a ground selection transistor GST. In one embodiment, the uppermost gate electrode 130 may be a string selection transistor SST. The gate electrodes 130 between the gate electrode 130 forming the ground selection transistor GST and the gate electrode 130 forming the string selection transistor SST may include memory cell transistors (MC1, MC2, . . . , and MC6).

The gate electrode 130 may include, for example, at least one of a conductive material (e.g., tungsten, copper, metal silicide), doped silicon, or a conductive metal nitride film. The structure formed by the gate electrodes 130 and the insulating film 110 stacked in the third direction D3 may be surrounded by the channel hole structure CH extending in the third direction D3.

The insulating films 110 may be between the gate electrodes 130, respectively, which are spaced apart from one another in the third direction D3. The insulating film 110 may include an insulating material such as silicon oxide, silicon nitride, and silicon oxynitride.

A gate insulating film 135 may be between the gate electrodes 130 and the insulating films 110. The gate insulating film 135 may be between the gate electrodes 130 and the channel hole structure CH. The gate insulating film 135 may include, for example, an insulating metal oxide having a dielectric constant greater than that of silicon oxide. The insulating metal oxide may include a high dielectric constant material such as aluminum oxide, hafnium oxide, lanthanum oxide, tantalum oxide, titanium oxide, lanthanum hafnium oxide, or a combination thereof.

The gate insulating film 135 is illustrated to have a single film structure in FIGS. 2 and 3. In other embodiments, the gate insulating film 135 may have, for example, a multilayer film structure, e.g., a stacked structure of silicon oxide and aluminum oxide.

A buffer film 105 may be between the gate electrode 130 and the substrate 100. The buffer film 105 may contact the upper surface of the substrate 100 and the gate insulating film 135. The buffer film 105 may include, for example, a silicon oxide film.

The buffer film 105 may be formed on the substrate 100 to expose at least a part of the common source region CSR.

The intermediate contact 140 may be on the contact pad 125 and may contact the contact pad 125 to electrically connect the channel hole structure CH to the first contact 145 or the intermediate wiring 150. Therefore, intermediate contact 140 may connect the channel hole structure CH with intermediate wiring 150 or the bit line BL.

The intermediate contact 140 may secure a contact area for the channel hole structure CH and the contact pad 125 to be connected to the first contact 145 and/or the intermediate wiring 150. The intermediate contact 140 may include, for example, at least one of polysilicon, a metal silicide compound, conductive metal nitride, or a metal.

Each of the intermediate wiring 150 and the bit line BL may be formed on the stacked structure of the channel hole structure CH, the gate electrode 130, and the insulating film 110 on the substrate.

The channel hole structures CH may be arranged in a two-dimensional pattern on the substrate 100. A plurality of cell strings (CS11, CS12, CS21 and CS22) including the channel hole structures may be electrically connected to the bit lines, respectively.

In one embodiment of the non-volatile memory device 1, each channel hole structure CH (and the intermediate contact 140 on the channel hole structure CH) may be connected to a respective bit line BL along a different path.

In one embodiment of the non-volatile memory device 1, channel hole structures CH2 and CH4 may be connected to the bit line BL through the intermediate wiring 150 and the channel hole structures CH1 and CH3 may be connected to a bit line BL through the first contact 145 without passing through intermediate wiring 150. For example, the first channel hole structure CH1 may be directly connected to the bit line BL1 via the first contact 145. Therefore, the first contact 145 may vertically overlap the intermediate contact 140 on the first channel hole structure CH1 and may contact upper bit line BL1.

On the other hand, the second channel hole structure CH2 may be connected to the bit line BL3 via the intermediate wiring 150 and the second contact 155. At least part of the intermediate wiring 150 may vertically overlap the intermediate contact 140 on the second channel hole structure CH2. Further, a second contact 155 may be formed on the intermediate wiring 150 to electrically connect the intermediate wiring 150 and the bit line BL3.

As illustrated in FIG. 1, the first channel hole structure CH1 and the third channel hole structure CH3 are disposed side-by-side in the first direction D1 and are directly connected to the bit line BL1 via the first contact 145, without being connected to the intermediate wiring 150. The first channel hole structure CH1 and the third channel hole structure CH3 may be, for example, channel hole structures CH1 and CH3 disposed in the odd-numbered columns. Other channel hole structures CH2 and CH4 adjacent to the channel hole structure CH1 and CH3 may be connected to the bit line BL3 via the intermediate wiring 150. The second channel hole structure CH2 and the fourth channel hole structure CH4 may be, for example, channel hole structures CH2 and CH4 arranged in even-numbered columns.

Therefore, the two channel hole structures CH1 and CH3 in the odd-numbered columns nearest to each other, and the two channel hole structures CH2 and CH4 in the even-numbered columns, may have different structures for connecting to bit lines. Further, the two channel hole structures CH2 and CH4 in the even-numbered columns may have different structures for connecting to the two channel hole structures CH5 and CH6 in other nearest odd-numbered columns and the bit line BL.

The intermediate wiring 150 may be between the bit lines BL1 and BL5 connected to the pairs (CH1 and CH3, CH5 and CH6) of the channel hole structures in the odd-numbered columns.

In addition, the channel hole structures having this arrangement may be on the substrate 100 in a matrix form. The matrix form may be, for example, a structure in which an arrangement of channel hole structures having a connection structure different from that of the bit line BL is alternately disposed in the first direction D1 and the second direction D2.

The first contact 145 and the second contact 155 are electrically connected to respective bit lines BL. In some embodiments, the width in the second direction D2 of the upper surface of the first contact 145 may be the same as the width in the second direction D2 of the upper surface of the second contact 155.

The first to fourth interlayer insulating films (160, 170, 180, and 190) may be sequentially stacked on the channel hole structure CH. In some embodiments, the first contact 145 may penetrate through the second and third interlayer insulating films 170 and 180, and the second contact 155 may penetrate through the third interlayer insulating film 180. Thus, the first contact 145 and the second contact 155 formed at the same level may penetrate through the second and third interlayer insulating films 170 and 180 to different depths.

The bit line BL may extend in the first direction D1. Twelve bit lines extending along the first direction D1 are illustrated in FIG. 1. A different number of bit lines may extend in the first direction D1 in another embodiment.

The plurality of bit lines BL may be spaced apart from each other at a predetermined interval in the second direction D2 orthogonal to the first direction D1. In the non-volatile memory device 1 according to one embodiment, the width of the bit line BL in the second direction D2 may be less than the width of the intermediate wiring 150 in the second direction. Further, the width of the bit line BL in the second direction D2 may be less than the diameter of the channel hole structure CH. When the upper surface shape of the channel hole structure CH has a polygonal shape, the width of the bit line BL in the second direction D2 may be less than the width of the channel hole structure CH in the second direction D2.

In the non-volatile memory device 1 according to one embodiment, the intermediate wiring 150 may be at least partially curved in the second direction D2. In FIG. 1, for example, the intermediate wiring 150 is connected to the third bit line BL3 via the second contact 155. However, the channel hole structures CH2 and CH4 connected to the intermediate wiring 150 may not be arranged with the third bit line BL3 in the third direction D3. Therefore, at least part of the intermediate wiring 150 may be curved in the second direction D2 to connect to the third bit line BL3.

The bit lines BL may be formed, for example, by double patterning technology (DPT) or quadruple patterning technology (QPT).

Figure 5:
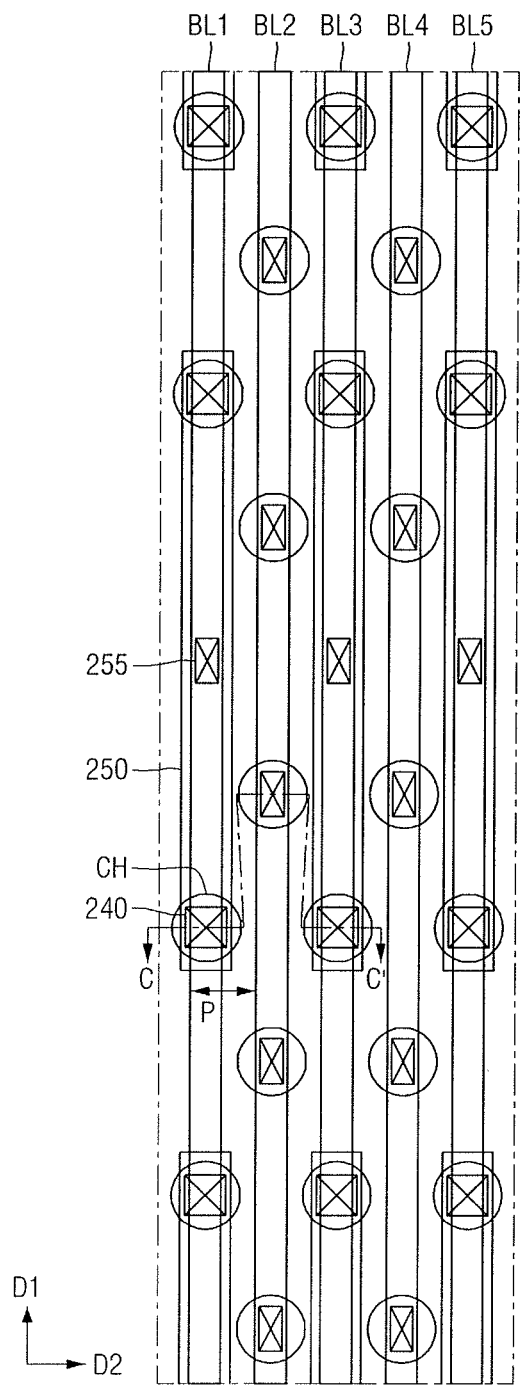
FIG. 5 illustrates another embodiment of a non-volatile memory device.
Figure 6:
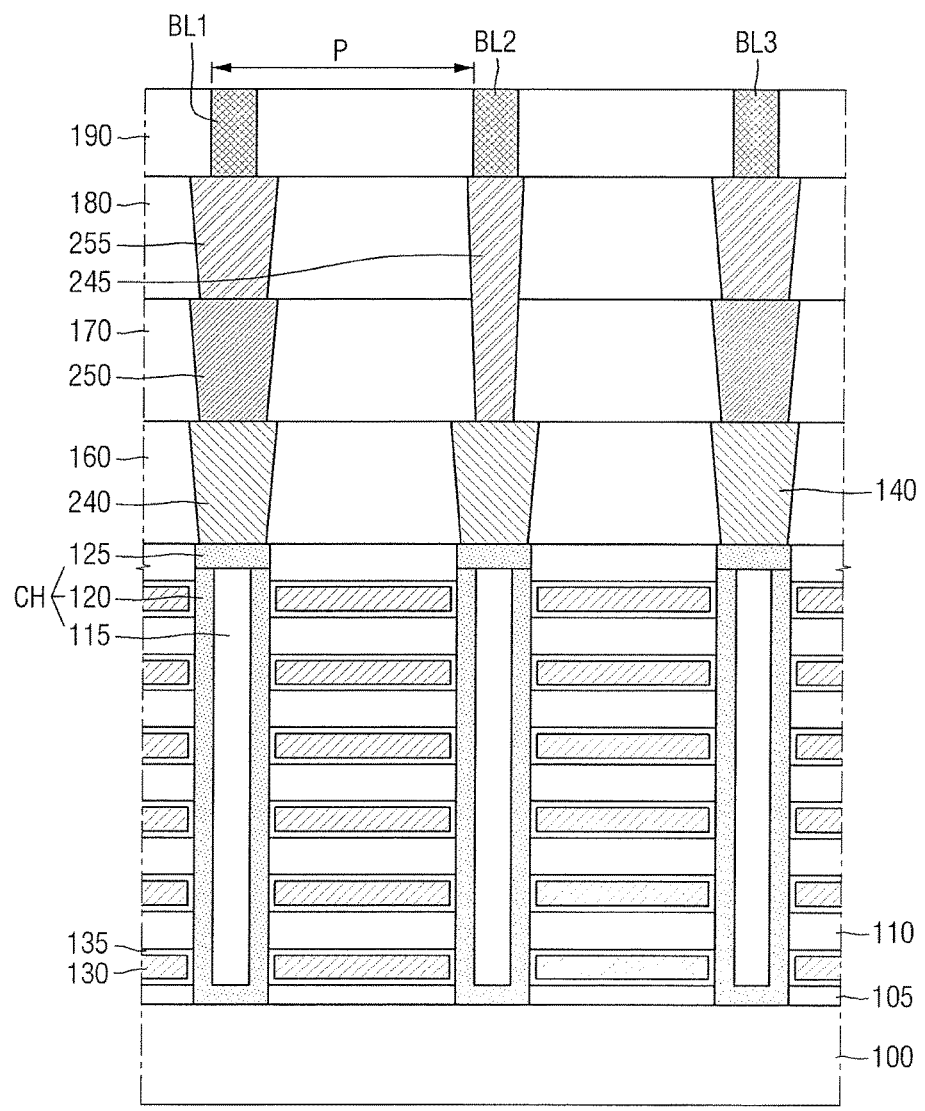
FIG. 6 illustrates a view along section line C-C' in FIG. 5.

FIG. 5 illustrates another embodiment of a non-volatile memory device 2. FIG. 6 illustrates a cross-sectional view of the non-volatile memory device 2 taken along the line C-C' of FIG. 5.

Referring to FIGS. 5 and 6, the non-volatile memory device 2 may include bit lines BL1 to BL5 and an intermediate wiring 250 having a shape different from the non-volatile memory device. The bit lines BL1 to BL5 may extend in the first direction D1 on the channel hole structure CH. The bit lines BL1 to BL5 may be spaced apart from each other at a predetermined interval in the second direction D2. The intermediate wiring 250 may extend in the same first direction D1 as the bit line BL. The intermediate wiring 250 may linearly extend along the first direction D1.

In the non-volatile memory device 2, an interval or a pitch P between the bit lines BL (which are spaced apart from each other in the second direction D2) may be less than a critical dimension CD of the exposure apparatus for forming the bit line BL. Therefore, due to limitations of the lithography resolution of the exposure apparatus, patterning of the first contact 240 for connecting the bit line BL and the intermediate wiring 250 may be difficult. In the non-volatile memory device 2 according to the present embodiment, the first contacts 240 are alternately disposed in some bit lines BL1, BL3 and BL5 among the bit lines spaced apart from one another in the second direction. Thus, it is possible to secure an interval between the first contacts 240.

Further, when the interval or pitch P in the second direction D2 of the bit lines BL spaced apart from each other is less than the critical dimension of the exposure apparatus, the interval between the second contacts 255 for directly connecting the bit line BL and the channel hole structure CH may also be influenced. Thus, it is difficult to pattern the second contact 255 which directly connects the bit line BL and the channel hole structure CH, due to limitations of lithography resolution of the exposure apparatus. In the non-volatile memory device 2 according to the present embodiment, the second contacts 255 are alternately disposed in some bit lines BL2 and BL4 among the bit lines spaced apart from one another in the second direction. Thus, it is possible to secure an interval between the second contacts 255.

Figure 7A:
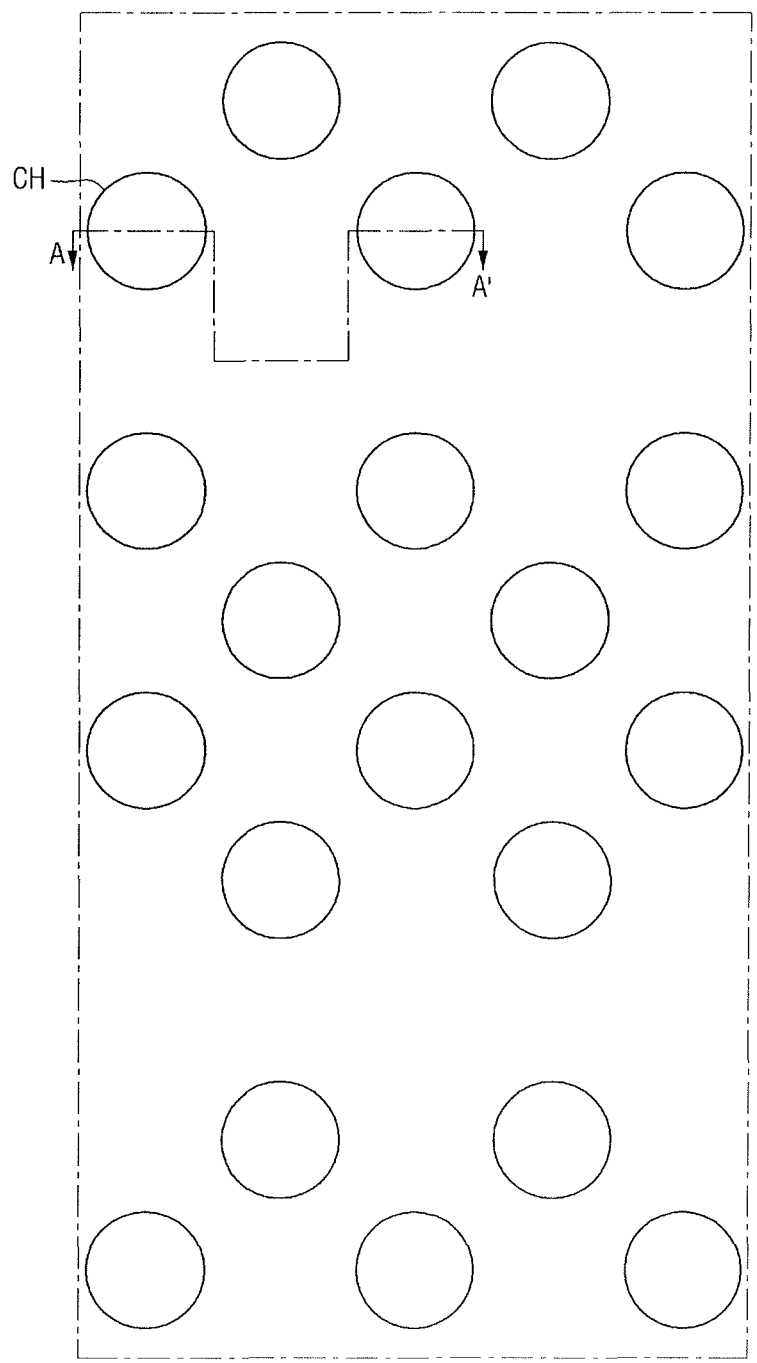
FIGS. 7A and 7A illustrate various stages of an embodiment of a method for manufacturing a non-volatile memory device.
Figure 7B:
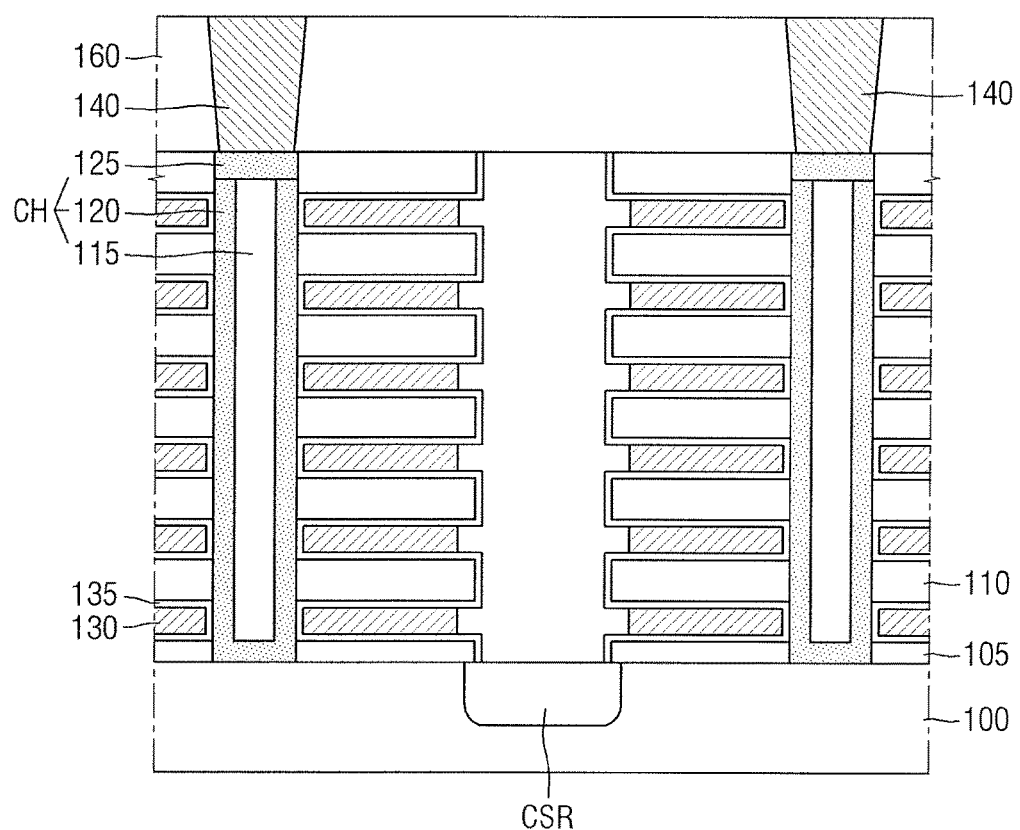

FIG. 7A illustrates an intermediate stage of an embodiment of a method for manufacturing a non-volatile memory device. FIG. 7B illustrates a cross-sectional view taken along line A-A' of FIG. 7A.

Referring to FIGS. 7A and 7B, a channel hole structure CH extends on the substrate 100 in a third direction D3. Gate electrodes 130 and insulating films 110 surround the channel hole structure CH and are stacked vertically. The substrate 100 may have, for example, a structure doped with a P-type semiconductor material. Formation of the buffer film 105 on the substrate 100 may include forming a silicon oxide film, for example, by thermally oxidizing the upper surface of the substrate 100.

The gate electrodes 130 and insulating films 110 may be alternately stacked on the buffer film 105. Such a structure may be formed, for example, by forming the insulating films 110 and sacrificial films alternately stacked on the substrate 100, forming a recessed region by selectively removing the sacrificial film, forming a storage film, forming the gate insulating films 135 on the surface of the recessed region in a conformal manner, and forming the gate electrodes 130 by filling the conductive material in the recessed region.

On the other hand, a channel hole structure CH penetrating through the gate electrode 130 and the insulating film 110 may be formed on the substrate 100. Formation of the channel hole structure CH may include sequential formation of a vertical insulating film 120, a filler insulating film 115, and a contact pad 125 inside the hole, after a hole is formed to penetrate through the stacked structure of the gate electrode 130 and the insulating film 110.

Formation of the vertical insulating film 120 and the filler insulating film 115 constituting the channel hole structure CH may include filling the vertical insulating film 120 and the filler insulating film 115, respectively, using, for example, chemical vapor deposition (CVD) or atomic layer deposition.

The intermediate contact 140 is formed on the channel hole structure CH. Formation of the intermediate contact 140 includes forming the first interlayer insulating film 160 on the channel hole structure CH, removing part of the first interlayer insulating film 160 aligned vertically with the contact pad 125, and forming the intermediate contact 140 by filling the removed first interlayer insulating film 160 with the conductive material. Filling the intermediate contact 140 with the conductive material may be performed, for example, by a Damascene process.

Figure 8A:
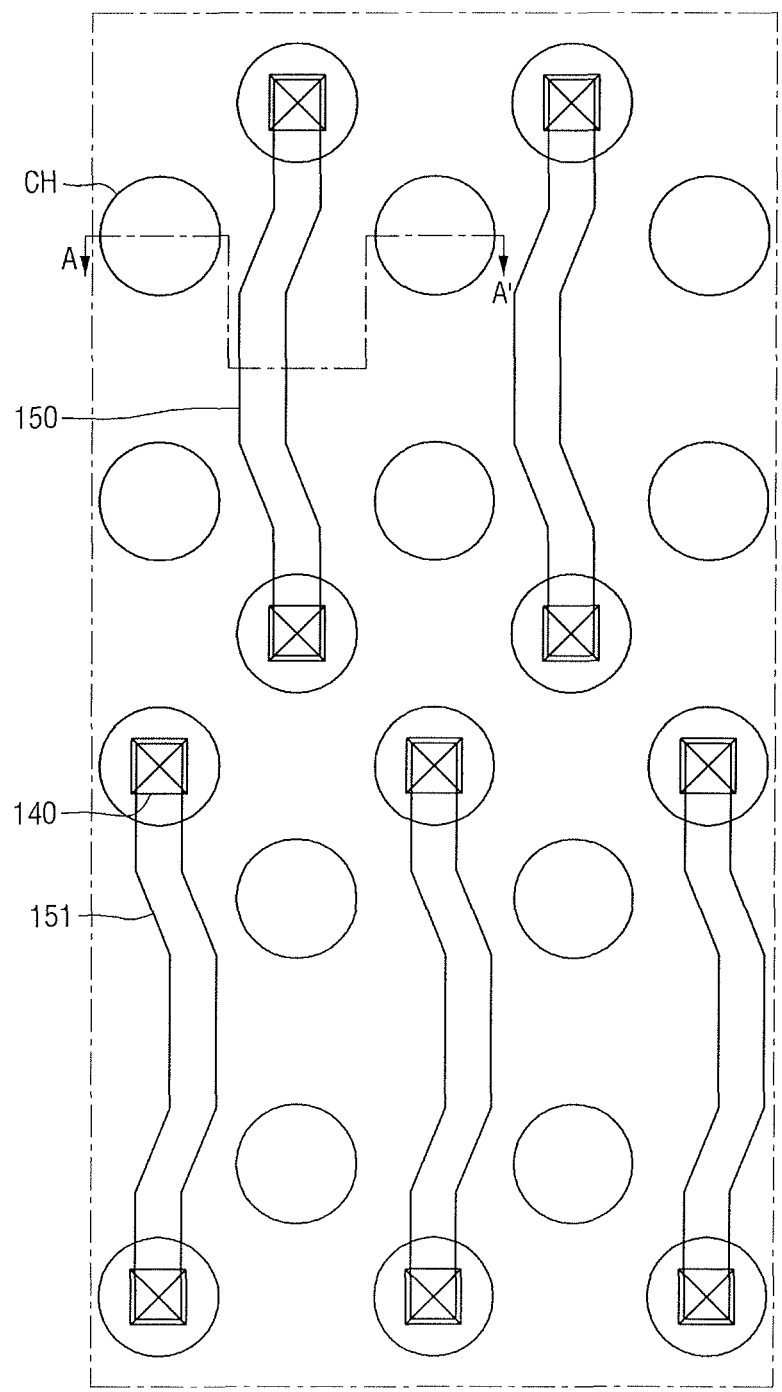
FIGS. 8A and 8B illustrate various stages of another embodiment of a method for manufacturing a non-volatile memory device.
Figure 8B:
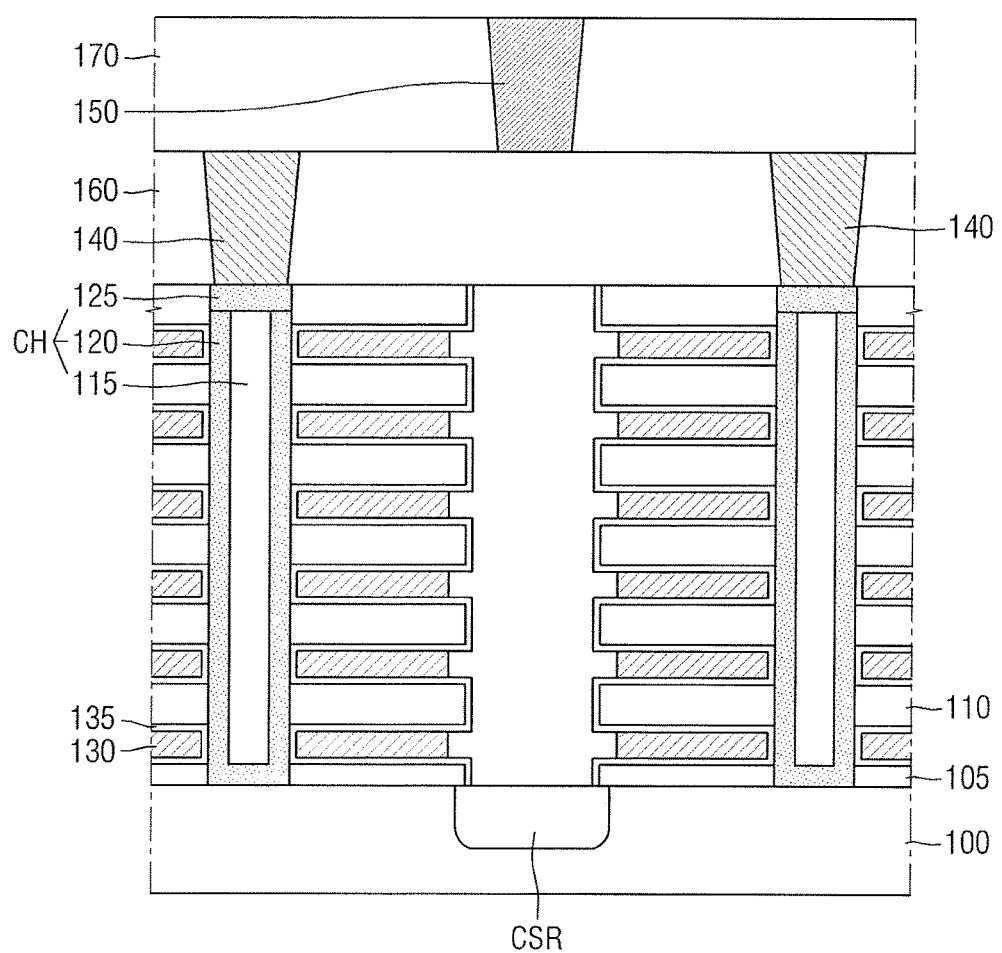

FIG. 8A illustrates an intermediate stage of another embodiment of a method for manufacturing a non-volatile memory device. FIG. 8B illustrates a cross-sectional view taken along the line A-A' of FIG. 8A.

Referring to FIGS. 8A and 8B, a second interlayer insulating film 170 and an intermediate wiring 150 are formed on the first interlayer insulating film 160. The second interlayer insulating film 170 may be formed, for example, using silicon oxide by CVD. However, the second interlayer insulating film 170 is not limited to one containing silicon oxide. For example, the second interlayer insulating film 170 may include a material having a predetermined etching selection ratio with respect to the intermediate contact 140.

As described above, the intermediate wiring 150 may be connected to part of the channel hole structure CH on the substrate. The intermediate wiring 150 may be arranged in a two-dimensional pattern. For example, the intermediate wiring 150 may include an arrangement where the intermediate wirings 150 are spaced apart from each other in the second direction D2, and/or another arrangement where the intermediate wiring 150 are offset in the second direction D2. The intermediate wiring 150 may be performed, for example, by a damascene process, e.g., similar to formation of the intermediate contact 140. The intermediate wiring 150 and the channel hole structure CH may be electrically connected to each other via the intermediate contact 140.

Figure 9A:
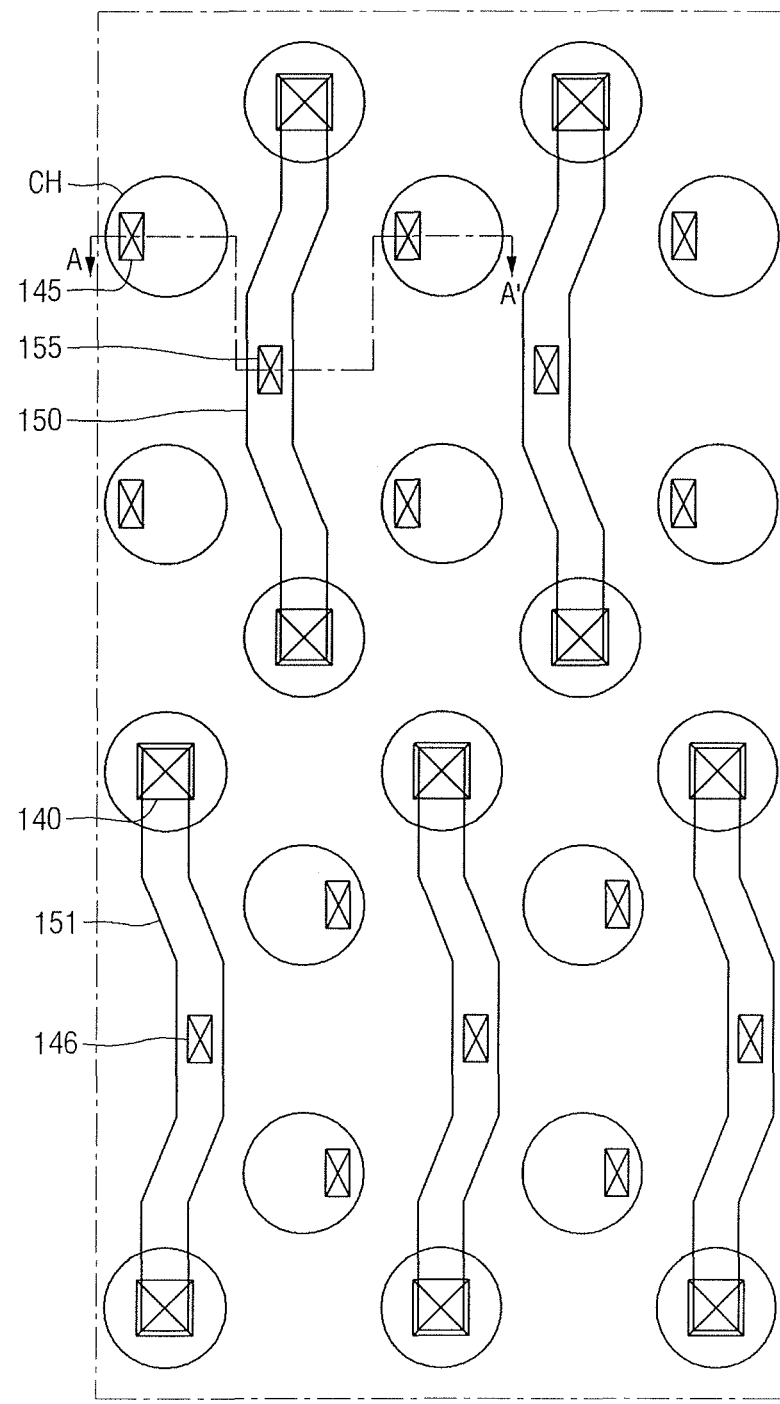
FIGS. 9A and 9B illustrate various stages of another embodiment of a method for manufacturing a non-volatile memory device.
Figure 9B:
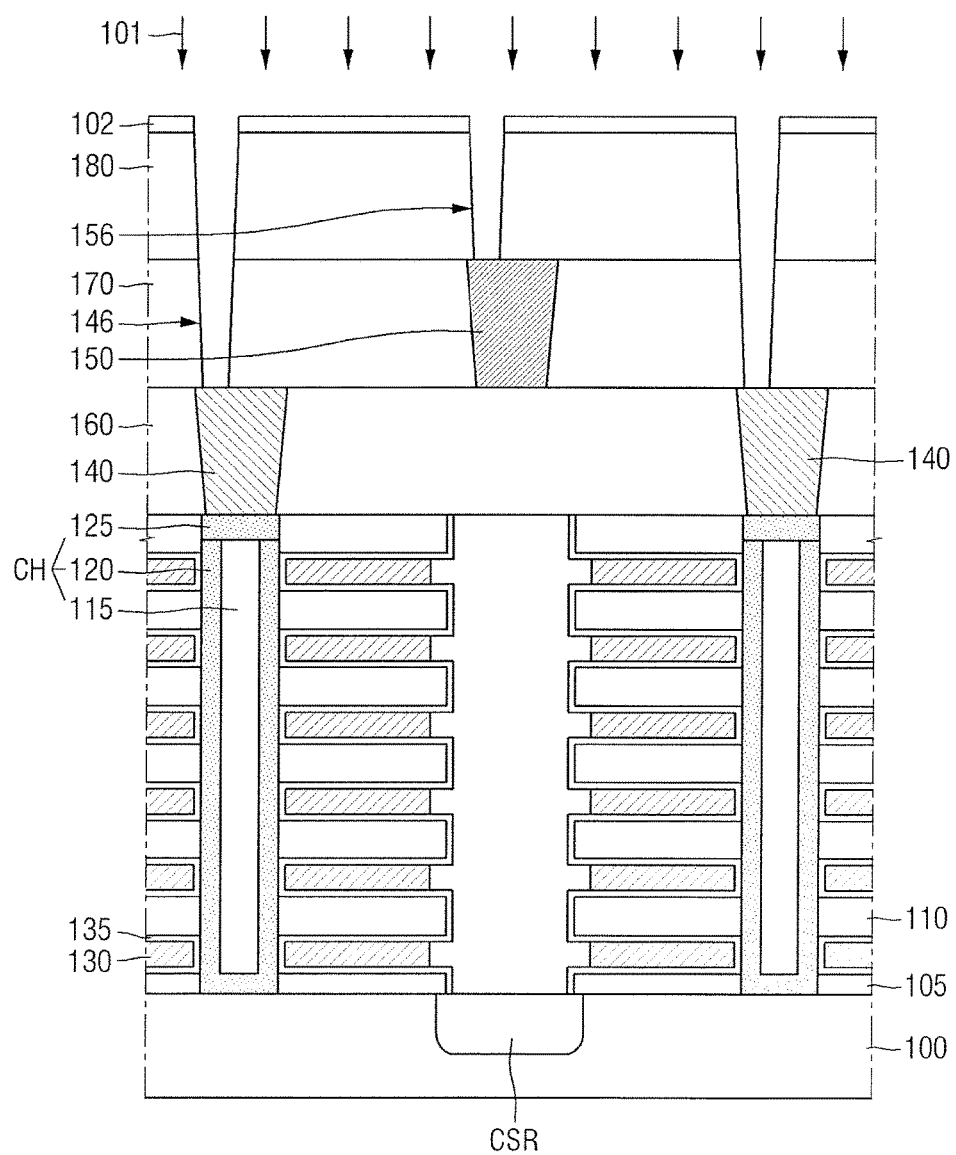

FIG. 9A illustrates an intermediate stage of another embodiment of a method for manufacturing a non-volatile memory device. FIG. 9B illustrates a cross-sectional view taken along the line A-A' of FIG. 9A.

Referring to FIGS. 9A and 9B, a third interlayer insulating film 180 is formed on the second interlayer insulating film 170, a mask pattern 102 is formed on the third interlayer insulating film 180, and contact holes 146 and 156 are formed using the mask pattern 102 as an etching mask. The third interlayer insulating film 180 may be formed, for example, by forming silicon oxide on the second interlayer insulating film 170 using the CVD. However, the third interlayer insulating film 180 is not limited to one containing silicon oxide. For example, the third interlayer insulating film 180 may be a material having a predetermined etching selection ratio with respect to the intermediate contact 140 or the intermediate wiring 150.

A mask pattern 102 for exposing a region including contact holes 146 and 156 is formed on the third interlayer insulating film 180. The mask pattern 102 may include, for example, silicon nitride, and may be a material having a predetermined etching selection ratio to the third interlayer insulating film 180.

The contact holes 146 and 156 are formed using the mask pattern 102 as an etching mask. The contact hole 146 exposes the intermediate contact 140. The contact hole 156 may expose the upper surface of the intermediate wiring 150. The contact hole 146 may be formed by sequentially etching the third interlayer insulating film 180 and the second interlayer insulating film 170. The contact hole 156 may be formed by etching the third interlayer insulating film 180.

As described above, the second interlayer insulating film 170 and the third interlayer insulating film 180 may be materials having an etching selection ratio with respect to the first contact and the intermediate wiring 150. When etching the second interlayer insulating film 170 and the third interlayer insulating film 180 to form the contact hole 146, etching of the contact hole 146 may be terminated by the intermediate contact 140 arranged perpendicularly to the contact hole 146.

Similarly, when etching the third interlayer insulating film 180 for forming the contact hole 156, etching of the contact hole 156 may be terminated by the intermediate wiring 150.

The contact holes 146 and 156 may be formed at the same level, e.g., the holes may be formed by the same manufacturing process. For example, the second interlayer insulating film 170 and the third interlayer insulating film 170 may be simultaneously formed by a process (101) of forming the mask pattern 102 on the third interlayer insulating film 170 and using the same etching gas by utilizing the mask pattern 102 as an etching mask, as illustrated in FIG. 9B.

Referring to FIGS. 2 and 3, a conductive material is filled in the contact holes 146 and 156 to form the first contact 145 and the second contact 155. The fourth interlayer insulating film 190 and the bit lines BL are formed on the third interlayer insulating film 180.

FIGS. 2 and 3 illustrate an example in which the first contact 145 and the first hit line BL1 are connected to each other, and the second contact 155 and the third bit line BL3 are connected to each other, among a plurality of bit lines BL spaced apart from each other at a predetermined interval in the second direction D2. As a result, the channel hole structure CH connected to the bit line BL through the second contact 155 and the intermediate wiring 150 is formed in a matrix, with the intermediate contact 140 and the channel hole structure CH connected to the line BL through the first contact 145.

In one embodiment, the contact hole 146 filled with the first contact 145 and the contact hole 156 filled with the second contact 155 may be formed at the same level. Similarly to the contact holes 146 and 156, the first contact 145 and the second contact 155 may be formed at the same level. For example, the contact holes 146 and 156 may be filled with a conductive material, and the surface of the third interlayer insulating film 180 may be flattened to expose the upper surface of third interlayer insulating film 180.

As described above, the width in the second direction D2 of the bit line BL in the non-volatile memory device 1 may be less than the width of the intermediate wiring 150 in the second direction D2. In order to form the bit line BL having the width, the bit line BL may be formed by a DPT which is double-patterned on the fourth interlayer insulating film 190. In one embodiment, the bit line BL may be formed by a single patterning process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A non-volatile memory device, comprising:
   a plurality of channel hole structures arranged in a two-dimensional pattern on and extending vertically from a substrate;
   a plurality of bit lines extending in a first direction, spaced apart from each other in a second direction crossing the first direction, and electrically connected to the plurality of channel hole structures; and
   an intemiediate wiring which connects channel hole structures in the first direction among the plurality of channel hole structures and the plurality of bit lines, wherein the plurality of bit lines includes a first bit line and a second bit line directly connected to the channel hole structures through a first contact and spaced apart in the second direction, and wherein the intermediate wiring is between the first bit line and the second bit line and is connected to a third bit line through a second contact having a different structure from the first contact.

2. The non-volatile memory device as claimed in claim 1, further comprising an intermediate contact which contacts the plurality of channel hole structures and connects the plurality of bit lines or the intermediate wiring and the plurality of channel hole structures.

3. The non-volatile memory device as claimed in claim 2, further comprising a contact on the intermediate contact and connecting the intermediate contact and one of the plurality of bit lines.

4. The non-volatile memory device as claimed in claim 1, wherein the first contact and the second contact are at a same level.

5. The non-volatile memory device as claimed in claim 3, further comprising a first interlayer insulating film and a second interlayer insulating film which are sequentially stacked on the plurality of channel hole structures.

6. The non-volatile memory device as claimed in claim 5, wherein:
   the first contact passes through the second interlayer insulating film, and the second contact passes through the first and second interlayer insulating films.

7. The non-volatile memory device as claimed in claim 1, wherein the plurality of channel hole structures connected by the intermediate wiring include at least two channel hole structures which are nearest to each other in the first direction.

8. The non-volatile memory device as claimed in claim 1, wherein a line pitch between the first bit line and the second bit line is less than a critical dimension of an exposure apparatus.

9. The non-volatile memory device as claimed in claim 8, wherein the intermediate wiring extends linearly along the first direction.

10. The non-volatile memory device as claimed in claim 1, wherein the bit line connects at least two channel hole structures of the plurality of channel hole structures which are nearest to each other in the first direction.

11. The non-volatile memory device as claimed in claim 1, further comprising:
  a plurality of gate electrodes and insulating films on the substrate,
  wherein the plurality of gate electrodes and the insulating films surround the plurality of channel hole structures and are alternately stacked on the substrate.

12. A non-volatile memory device, comprising:
  a plurality of intermediate contacts arranged in a two-dimensional pattern on and connected to a lower film;
  a plurality of bit lines on the plurality of intermediate contacts and directly connected to the intermediate contacts arranged along a first direction; and
  a plurality of intermediate wirings connecting at least a pair of intermediate contacts between bit lines connected to a plurality of intermediate contacts among the plurality of bit lines and disposed along a first direction among the plurality of intermediate contacts, and the bit lines which are not connected to the intermediate contacts, wherein the intermediate contacts include:
  a first intermediate contact directly connected to the bit line, and
  a second intermediate contact connected to the bit lines through the bit lines and the intermediate wirings, and
  the first intermediate contact and the second intermediate contact are in a matrix form which alternates in a second direction orthogonal to the first direction.

13. The non-volatile memory device as claimed in claim 12, further comprising:
  a substrate in the lower film; and
  channel hole structures arranged in a two-dimensional pattern on the substrate and extending perpendicularly from the substrate.

14. The non-volatile memory device as claimed in claim 13, wherein the channel hole structures are aligned perpendicularly to the intermediate contacts.

15. The non-volatile memory device as claimed in claim 12, further comprising:
  a first contact which connects the first intermediate contact to the bit line, and
  a second contact which connects the intermediate wiring to the bit line.

16. A non-volatile memory device, comprising:
  channel hole structures;
  bit lines connected to the channel hole structures; and
  an intermediate wiring connecting the channel hole structures and the bit lines,
  wherein the bit lines include a first bit line and a second bit line directly connected to the channel hole structures through a first contact and wherein the intermediate wiring is between the first bit line and the second bit line and is connected to a third bit line through a second contact having a different structure from the first contact.

17. The non-volatile memory device as claimed in claim 16, further comprising an intermediate contact which contacts the channel hole structures.

18. The non-volatile memory device as claimed in claim 16, further comprising a contact on the intermediate contact and connecting the intermediate contact and one or more of the bit lines.

19. The non-volatile memory device as claimed in claim 16, wherein the first contact and the second contact are at a same level.

20. The non-volatile memory device as claimed in claim 16, further comprising a first interlayer insulating film and a second interlayer insulating film which are sequentially stacked on the channel hole structures.

* * * * *